United States Patent
Irii et al.

(10) Patent No.: US 10,893,354 B2
(45) Date of Patent: Jan. 12, 2021

(54) HEADSET

(71) Applicant: Audio-Technica Corporation, Tokyo (JP)

(72) Inventors: Koichi Irii, Tokyo (JP); Mika Ito, Tokyo (JP); Kosumo Miyauchi, Tokyo (JP); Yutaka Akino, Tokyo (JP)

(73) Assignee: AUDIO-TECHNICA CORPORATION, Tokyo (JP)

( * ) Notice: Subject to any disclaimer, the term of this patent is extended or adjusted under 35 U.S.C. 154(b) by 0 days.

(21) Appl. No.: 16/796,345

(22) Filed: Feb. 20, 2020

(65) Prior Publication Data

US 2020/0280791 A1  Sep. 3, 2020

(30) Foreign Application Priority Data

Mar. 1, 2019 (JP) .................. 2019-037433

(51) Int. Cl.
*H04R 1/10* (2006.01)
*H03G 5/00* (2006.01)
*H04R 1/08* (2006.01)

(52) U.S. Cl.
CPC ............ *H04R 1/1041* (2013.01); *H04R 1/08* (2013.01); *H04R 1/1008* (2013.01); *H04R 1/1075* (2013.01)

(58) Field of Classification Search
CPC . H04R 2420/05; H04R 2420/03; H03G 3/348
USPC .................................................. 381/74, 104
See application file for complete search history.

(56) References Cited

U.S. PATENT DOCUMENTS

| 5,353,347 A | 10/1994 | Irissou et al. |
| 6,681,020 B1 | 1/2004 | Papopoulos et al. |
| 6,751,316 B1 | 6/2004 | Gligoric |

FOREIGN PATENT DOCUMENTS

| GB | 2 342 798 A | 4/2000 |
| GB | 2 344 711 A | 6/2000 |
| JP | 07058811 A | 3/1995 |
| JP | 2003-188967 A | 7/2003 |

OTHER PUBLICATIONS

European Search Report for: EP 20 16 0088, dated Jun. 26, 2020.

*Primary Examiner* — George C Monikang
(74) *Attorney, Agent, or Firm* — W&C IP

(57) ABSTRACT

A headset includes: a microphone, a first transmission line that transmits a first electrical signal generated by the microphone to an external device; an operation switch that receives an operation for switching between (i) a non-mute state in which the first electrical signal is transmitted to the external device and (ii) a mute state in which the first electrical signal is not transmitted to the external device; an electronic switch that switches between (i) a conductive state in which the first electrical signal is transmitted and (ii) a non-conductive state in which the first electrical signal is not transmitted, on the basis of a control voltage which changes according to the state of the operation switch; and a voltage generator that generates the control voltage.

7 Claims, 4 Drawing Sheets

HEADSET

CROSS-REFERENCE TO RELATED APPLICATIONS

The present application claims priority to Japanese Patent Applications number 2019-037433, filed on Mar. 1, 2019. The contents of this application are incorporated herein by reference in their entirety.

BACKGROUND OF THE INVENTION

The present invention relates to a headset with a microphone.

Conventionally, a microphone provided with a switch for muting is known (refer to Japanese Unexamined Patent Application Publication No. 2003-188967, for example).

When a switch for muting is switched while sound is input to a microphone, there is a problem that noise is generated.

BRIEF SUMMARY OF THE INVENTION

This invention focuses on this point, and an object of the invention is to reduce the noise generated when the microphone is switched to a mute state.

A headset according to the present invention includes: a microphone that converts a sound to a first electrical signal; a first transmission line that transmits the first electrical signal generated by the microphone to an external device; a connection terminal that connects the first transmission line to the external device, an operation switch that receives an operation for switching between (i) a non-mute state in which the first electrical signal is transmitted to the external device and (ii) a mute state in which the first electrical signal is not transmitted to the external device; an electronic switch that switches between (i) a conductive state in which the first electrical signal is transmitted and (ii) a non-conductive state in which the first electrical signal is not transmitted, on the basis of a control voltage which changes according to the state of the operation switch, the electronic switch being provided between the microphone and the connection terminal; and a voltage generator that generates the control voltage.

DETAILED DESCRIPTION OF THE INVENTION

Hereinafter, the present invention will be described through exemplary embodiments of the present invention, but the following exemplary embodiments do not limit the invention according to the claims, and not all of the combinations of features described in the exemplary embodiments are necessarily essential to the solution means of the invention.

The First Embodiment

[Outline of a Headset 100]

Figure 1:
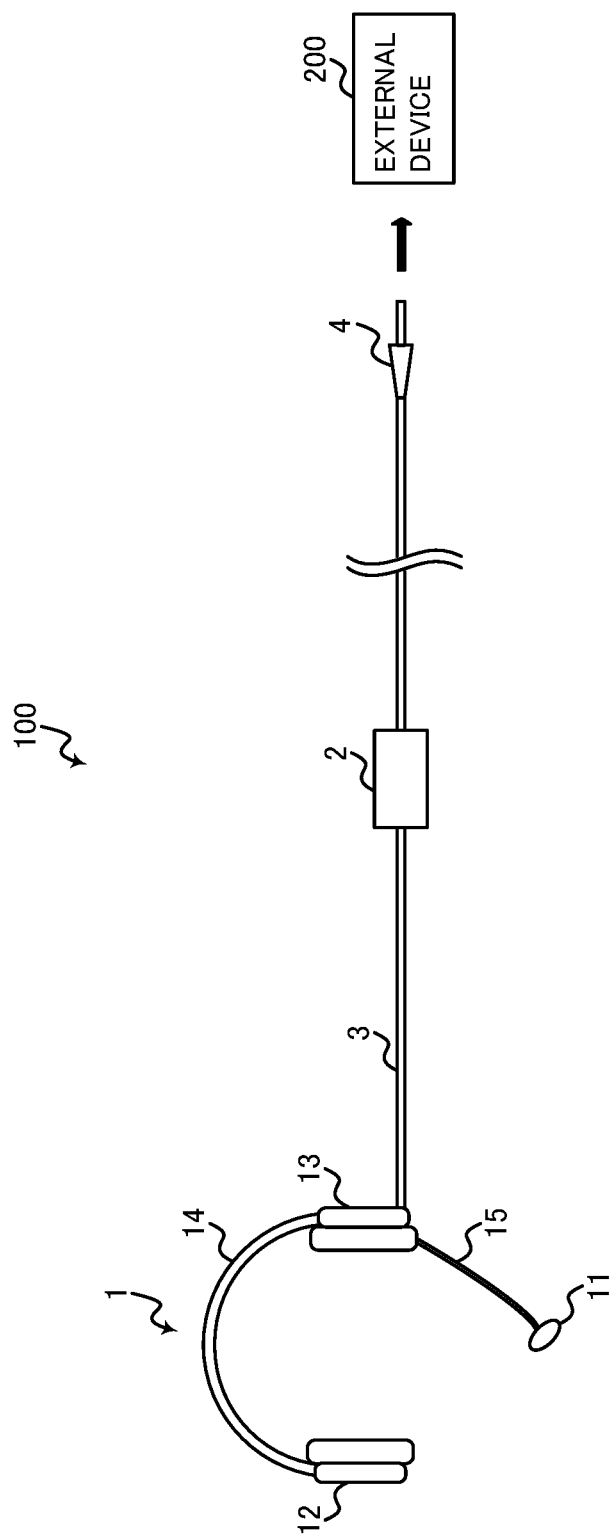
FIG. 1 shows a configuration of a headset according to the first embodiment.

FIG. 1 shows a configuration of a headset 100 according to the first embodiment. The headset 100 is equipment that is used by being connected to an external device 200, and is capable of (i) inputting a first electrical signal based on a sound collected in the headset 100 to the external device 200, and (ii) emitting a sound, based on a second electrical signal output from the external device 200, from a speaker.

The external device 200 is, for example, a gaming device, an audio device, a communication device, a smartphone, or a computer. The external device 200 can emit the sound based on the first electrical signal input from the headset 100, and output the second electrical signal via the headset 100 by converting sound data read from a medium, in which the sound data is stored, into the second electrical signal. The external device 200 may transmit the first electrical signal received from the headset 100 to another device via a network, or may output the second electrical signal received from another device to the headset 100.

The headset 100 includes a headset body 1, a mute operation part 2, a cable 3, and a connection terminal 4. The headset body 1 is a device which is mounted on a human head, collects ambient sounds, and emits the sound based on the second electrical signal received from the external device 200.

The headset body 1 includes a microphone 11, a right speaker 12, a left speaker 13, a headband 14, and an arm 15. The microphone 11 converts a sound into the first electrical signal. The microphone 11 is, for example, an electret condenser microphone. The right speaker 12 and the left speaker 13 output the sound based on the second electrical signal received from the external device 200.

The headset body 1 is connected to the external device 200 via the cable 3. The headset body 1 can transmit the first electrical signal to the external device 200 and receive the second electrical signal from the external device 200 while the connection terminal 4 provided at one end of the cable 3 is connected to the external device 200.

The mute operation part 2 is an operation part for switching between (i) a mute state in which the first electrical signal based on the sound collected in the microphone 11 is not input to the external device 200 and (ii) a non-mute state in which the first electrical signal is input to the external device 200. A user of the headset 100 can switch between the mute state and the non-mute state by operating an operation switch 21, which will be described later, provided in the mute operation part 2.

The connection terminal 4 is, for example, a connector plug provided at a tip of the cable 3 for connecting the cable 3 to the external device 200. The connection terminal 4 conforms to plug-in power standards, for example, and is capable of transmitting the first electrical signal from the headset body 1 to the external device 200, transmitting the second electrical signal from the external device 200 to the headset body 1, and providing power supplied from the external device 200 to the mute operation part 2.

[Internal Structure of the Headset 100]

Figure 2:
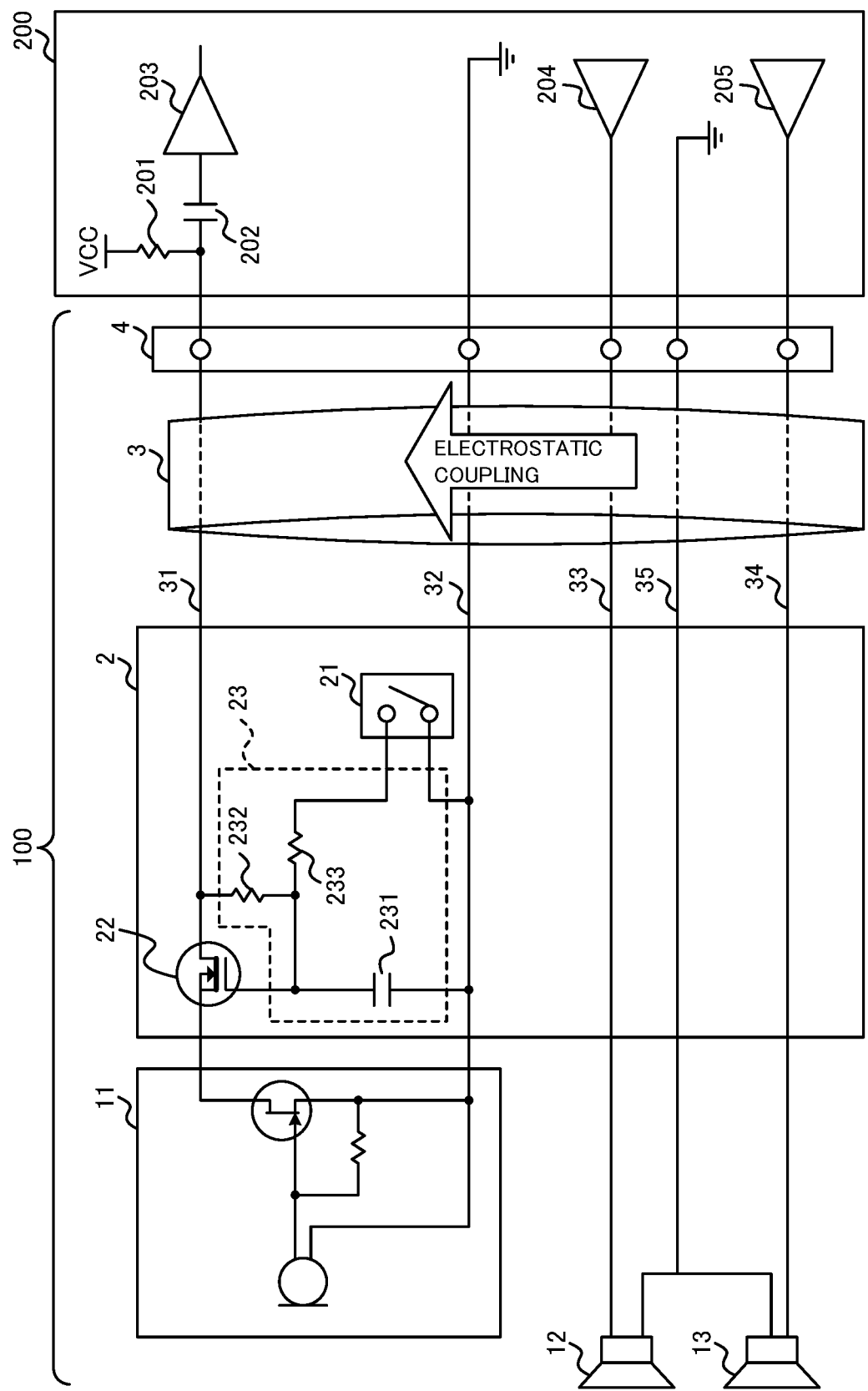
FIG. 2 schematically shows internal structures of the headset and an external device.

FIG. 2 schematically shows internal structures of the headset 100 and the external device 200. As shown in FIG. 2, the cable 3 accommodates a first transmission line 31, a ground wire 32, a second transmission line 33, a third transmission line 34, and a ground wire 35, and the respective transmission lines are connected to the external device 200 via the connection terminal 4.

The first transmission line 31 is a transmission line for transmitting the first electrical signal generated by the microphone 11 to the external device 200, and is connected to an input circuit of the external device 200 via the connection terminal 4. The input circuit of the external device 200 includes a resistor 201, a capacitor 202, and an amplifier 203. Power is supplied to the first transmission line 31 from a power source (VCC) connected via the resistor 201. The first electrical signal transmitted through the first transmission line 31 is input to the amplifier 203 via the capacitor 202.

The ground wire 32 is a ground wire connected to a ground of the external device 200. The ground wire 32 is connected to one of a plurality of terminals of the microphone 11.

The second transmission line 33 and the third transmission line 34 are accommodated in the cable 3 together with the first transmission line 31, and transmit the second electrical signal from the external device 200 to the right speaker 12 and the left speaker 13. The second transmission line 33 is connected to an amplifier 204 included in an output circuit of the external device 200 and to the right speaker 12. The second transmission line 33 transmits the second electrical signal corresponding to a sound emitted from the right speaker 12. The third transmission line 34 is connected to an amplifier 205 included in the output circuit of the external device 200 and to the left speaker 13. The third transmission line 34 transmits the second electrical signal corresponding to a sound emitted from the left speaker 13.

The ground wire 35 is a ground wire connected to the ground of the external device 200. The ground wire 35 is connected to one of a plurality of terminals of the right speaker 12 and the left speaker 13.

Hereinafter, the configuration of the mute operation part 2 will be described in detail while referring to FIG. 2. The mute operation part 2 includes an operation switch 21, an electronic switch 22, and a voltage generator 23. The voltage generator 23 includes a capacitor 231, a resistor 232, and a resistor 233.

The operation switch 21 is a device for receiving a switching operation between (i) a non-mute state in which the first electrical signal is transmitted to the external device 200 and (ii) a mute state in which the first electrical signal is not transmitted to the external device 200. The operation switch 21 may be any device as long as it can switch between conductive and non-conductive states, and is, for example, a slide switch, a tact switch, or a push switch. One end of the operation switch 21 is connected to the ground, and the other end of the operation switch 21 is connected to the voltage generator 23. FIG. 2 shows the non-mute state in which the operation switch 21 is not conducting.

The electronic switch 22 is provided between the microphone 11 and the external device 200, and switches between (i) the conductive state in which the first electrical signal is transmitted and (ii) the non-conductive state in which the first electrical signal is not transmitted. The electronic switch 22 is, for example, an N-channel metal oxide semiconductor field effect transistor (MOSFET). A source terminal of the electronic switch 22 is connected to the microphone 11, a gate terminal of the electronic switch 22 is connected to the voltage generator 23, and a drain terminal of the electronic switch 22 is connected to the external device 200 via the first transmission line 31 and the connection terminal 4. The electronic switch 22 switches between the conductive state and the non-conductive state on the basis of a control voltage input from the voltage generator 23 to the gate terminal.

The electronic switch 22 is in the conductive state when the control voltage is at a high level, and is in the non-conductive state when the control voltage is at a low level. The high-level voltage is, for example, a voltage equal to or greater than the maximum voltage of the first electrical signal input from the microphone 11. The low-level voltage is, for example, a voltage less than the minimum voltage of the first electrical signal input from the microphone 11.

When the control voltage input to the gate terminal is at the high level, the gate voltage becomes higher than the source voltage, and therefore the electronic switch 22 enters into the conductive state. When the control voltage is at the low level, the gate voltage becomes lower than the source voltage, and therefore the electronic switch 22 enters into the non-conductive state. In the conductive state of the electronic switch 22, the electronic switch 22 outputs the first electrical signal, which is input to the source terminal from the microphone 11, from the drain terminal with almost no attenuation of the first electrical signal, and therefore the headset 100 enters into the non-mute state. On the other hand, in the non-conductive state of the electronic switch 22, the electronic switch 22 does not transmit the first electrical signal, which is input to the source terminal from the microphone 11, to the drain terminal, and therefore the headset 100 enters into the mute state.

The voltage generator 23 generates a control voltage for controlling the electronic switch 22 to switch between the conductive state and the non-conductive state of the electronic switch 22. The voltage generator 23 generates the control voltage corresponding with the state of the operation switch 21. If the electronic switch 22 is the N-channel MOSFET, the voltage generator 23 generates a low-level control voltage when the operation switch 21 is conducting, and generates a high-level control voltage when the operation switch 21 is not conducting. The voltage generator 23 generates the control voltage on the basis of the power supplied from the external device 200 via the first transmission line 31.

The capacitor 231 is provided between the gate terminal of the electronic switch 22 and the ground. The resistor 232 is provided between the gate terminal and the drain terminal of the electronic switch 22. The resistor 233 is provided between the gate terminal of the electronic switch 22 and the operation switch 21. One end of the resistor 233, which is opposite to the gate terminal side, enters into an open state when the operation switch 21 is in the non-mute state (the state shown in FIG. 2). One end of the resistor 233, which is opposite to the gate terminal side, enters into a state connected to the ground when the operation switch 21 is in the mute state (the operation switch 21 is in a closed state).

Since one end of the resistor 233 is open in the non-mute state shown in FIG. 2, power is supplied from the external device 200 via the resistor 232, and therefore the high-level control voltage is input to the gate terminal of the electronic switch 22. As a result, the electronic switch 22 enters into the conductive state, and the first electrical signal, which is input to the source terminal from the microphone 11, is output from the drain terminal.

On the other hand, when the operation switch 21 is switched to the mute state by the user's operation, one end of the resistor 233 is connected to the ground, and therefore the voltage of the control voltage input to the gate terminal of the electronic switch 22 changes to the low level. As a result, the electronic switch 22 enters into the non-conductive state, and the first electrical signal, which is input to the source terminal from the microphone 11, is not output from the drain terminal. It is preferable that a resistance value of the resistor 233 is sufficiently smaller than a resistance value of the resistor 232 so that the voltage of the gate terminal of the electronic switch 22 in the mute state becomes sufficiently low. The resistance value of the resistor 233 is, for example, equal to or more than 1/10 and equal to or less than 1/5 of the resistance value of the resistor 232.

When the operation switch 21 enters into the conductive state, a bypass connecting the first transmission line 31, the resistor 232, the resistor 233, the operation switch 21, and the ground wire 32, in this order, is formed. As a result, the level of the first electrical signal input to the amplifier 203 of the external device 200 becomes smaller because a part of the first electrical signal flows to the ground via the bypass. In the mute operation part 2, the electronic switch 22 is switched to the non-conductive state after the level of the first electrical signal input to the external device 200 is decreased in this manner, and therefore the level of noise input to the external device 200 can be reduced.

The capacitor 231 and the resistor 232 function as a delay circuit that makes a time required for a transition of the level of the control voltage longer than a time required for switching of the operation switch 21. Specifically, due to the capacitor 231 provided between the gate terminal of the electronic switch 22 and the ground, the rate of voltage change at the time of transition of the voltage of the gate terminal of the electronic switch 22 from the high level to the low level is reduced. Specifically, a time required for the voltage of the gate terminal of the electronic switch 22 to change from the high level to the low level is longer than a time required for the operation switch 21 to change from the non-conducting state (non-mute state) to the conducting state (mute state).

Since the control voltage gradually changes from the high level to the low level, an impedance between the source terminal and the drain terminal of the electronic switch 22 gradually changes. As a result, noise due to a change in impedance that would occur when the operation switch 21 is switched to the mute state is hardly generated even if some components of the first electrical signal are input to the external device 200.

Figure 3:
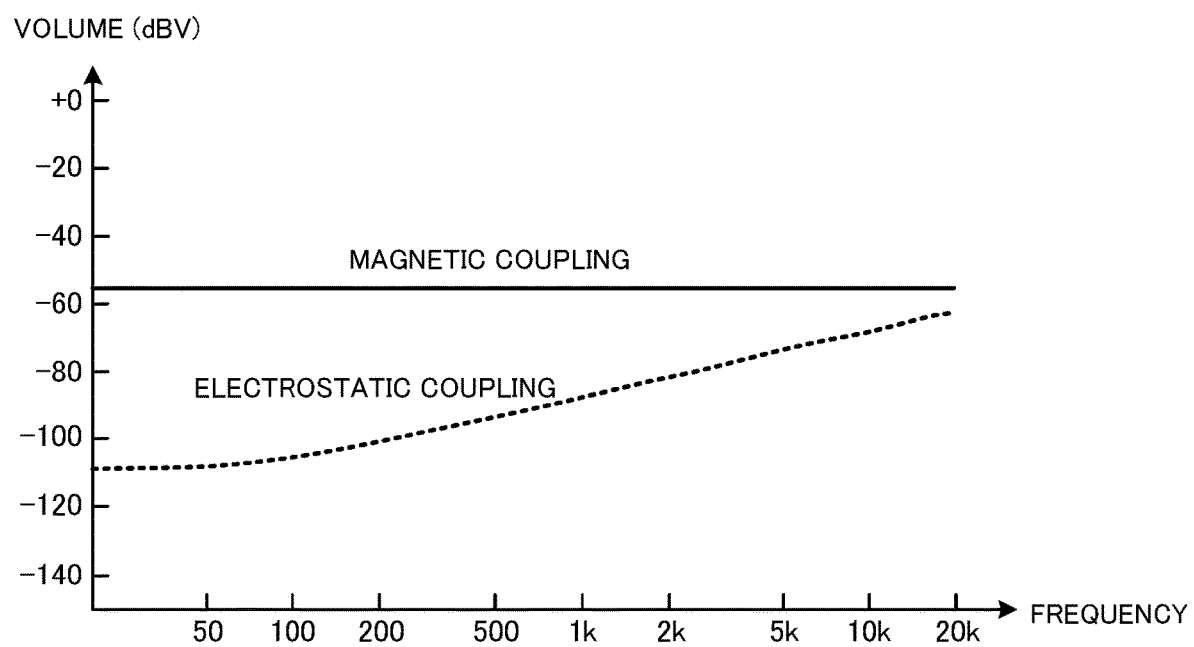
FIG. 3 shows frequency characteristics of a level of sound transmitted between transmission lines by electrostatic coupling and magnetic coupling.

It should be noted that when a plurality of transmission lines are accommodated in the same cable, an electrostatic coupling due to induction by mutual capacitances between the transmission lines or a magnetic coupling due to induction by mutual inductances between the transmission lines rarely occurs. FIG. 3 shows frequency characteristics of a level of sound transmitted between the transmission lines by the electrostatic coupling and the magnetic coupling. As shown in FIG. 3, the level of sound induced between the transmission lines by magnetic coupling is approximately constant regardless of the frequency of sound. On the other hand, the level of sound induced between the transmission lines by the electrostatic coupling is less than the level of sound induced between the transmission lines by the magnetic coupling in an audible frequency region. In particular, the lower the frequency, the lower the level of sound induced between the transmission lines by capacitive coupling.

In the configuration shown in FIG. 2, since the resistor 232 and the resistor 233 are provided in series with the operation switch 21, the current flowing from the first transmission line 31 to the ground wire 32 becomes sufficiently small in the mute state. As a result, in the headset 100 having the configuration shown in FIG. 2, the magnetic coupling among the first transmission line 31, the second transmission line 33, and the third transmission line 34 is less likely to occur, and the problem of the sound based on the second electrical signal, which is transmitted via the second transmission line 33 and the third transmission line 34, being input to the external device 200 via the first transmission line 31 can be prevented. As such, the magnetic coupling hardly occurs according to the configuration of the headset 100, and therefore even if the first transmission line 31, the ground wire 32, the second transmission line 33, the third transmission line 34, and the ground wire 35 are in close contact with each other, sound leakage hardly occurs, which is preferable when the cable 3 needs to be thinned.

Variation Example 1

In the above explanation, the voltage generator 23 configured with analog elements was illustrated as an example, but the voltage generator 23 may be configured with digital circuits. For example, the voltage generator 23 may include a central processing unit (CPU) and a DA converter, wherein the voltage generator 23 may generate a digital value according to the state of the operation switch 21 by executing programs with the CPU, and may generate a control voltage by converting the digital value into an analog signal with the DA converter.

Variation Example 2

In the above explanation, the headset 100 including the right speaker 12 and the left speaker 13 was illustrated as an example, but the headset 100 does not need to include the right speaker 12 and the left speaker 13. That is, the headset 100 may have a function of inputting sound, and does not need to have a function of outputting sound. Also, the headset 100 may have one speaker.

Variation Example 3

In the above explanation, an N-channel MOSFET was illustrated as an example of the electronic switch 22, but the electronic switch 22 may be another device. For example, the electronic switch 22 may include a P-channel MOSFET and may include a bipolar transistor.

Variation Example 4

In the above explanation, an electret condenser microphone was illustrated as an example of the microphone 11, but the microphone 11 may be another microphone. However, the configuration of the headset 100 is suitable for an electret condenser microphone that requires a large capacity of power.

[Effects of the Headset 100]

As described above, the headset 100 includes the operation switch 21 that receives the switching operation between the non-mute state and the mute state, the voltage generator 23 that generates the control voltage corresponding to the state of the operation switch 21, and the electronic switch 22 that switches between (i) the conductive state in which the first electrical signal is transmitted and (ii) the non-conductive state in which the first electrical signal is not transmitted, on the basis of the control voltage. With this configuration of the headset 100, the first transmission line 31 is disconnected by the electronic switch 22 after the potential of the first transmission line 31 is lowered to the level close to the ground potential, and therefore noise is hardly transmitted to the external device 200.

Further, since the control voltage for changing the electronic switch 22 to the non-conductive state gradually changes, it is possible to reduce noise generated when the electronic switch 22 disconnects the first transmission line 31 even if some components of the first electrical signal are input to the external device 200.

Furthermore, since the electronic switch 22 has the resistor 232 and the resistor 233, the impedance of a loop formed by the first transmission line 31 and the ground wire 32 in the mute state is high, so that (i) the current flowing through the loop is small, and (ii) the magnetic coupling is less likely to occur among the first transmission line 31, the second transmission line 33, and the third transmission line 34. As a result, the sound based on the second electrical signal transmitted on the second transmission line 33 and the third transmission line 34 can be prevented from being output from the external device 200 or being transmitted from the external device 200 to another device.

The Second Embodiment

Figure 4:
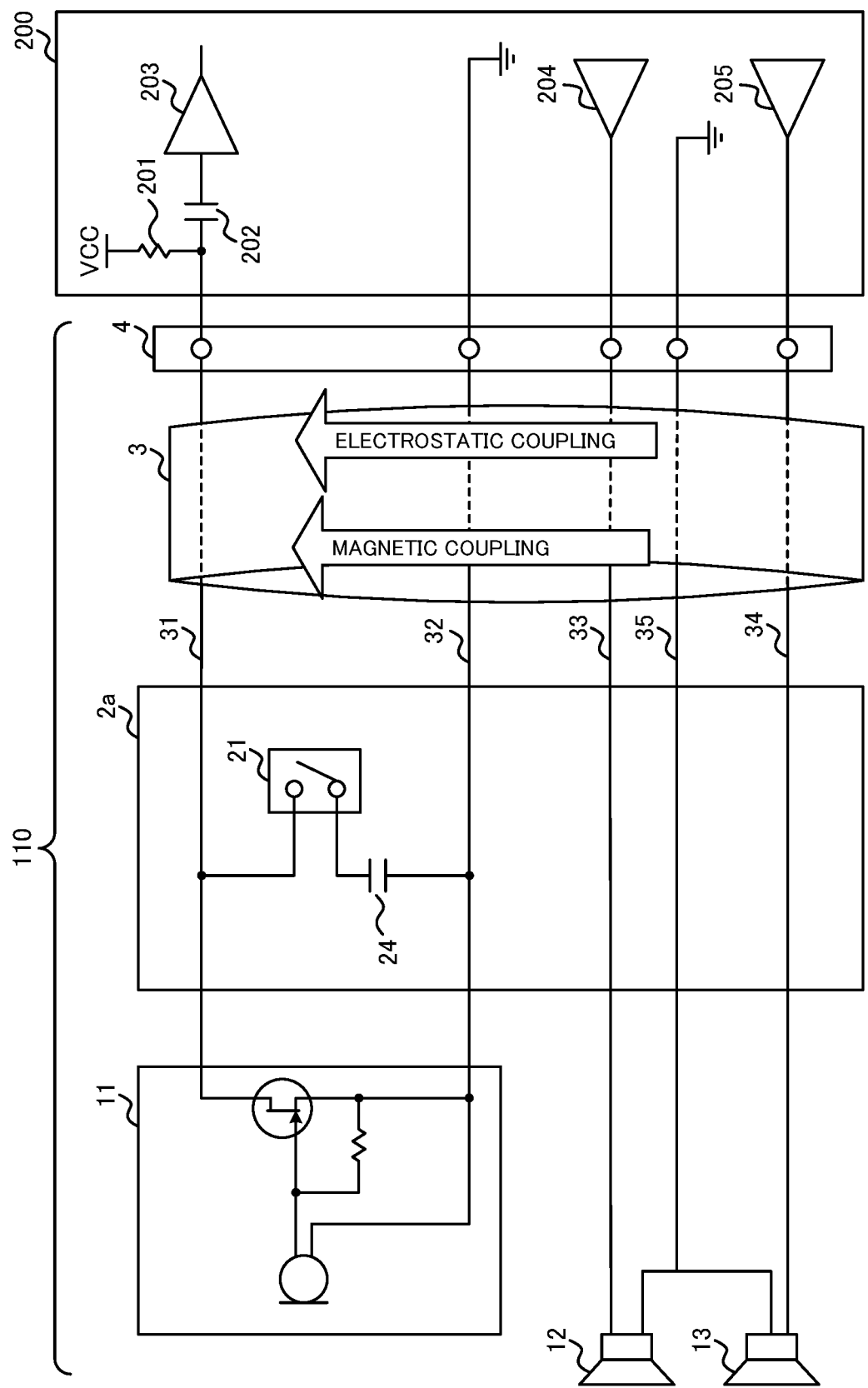
FIG. 4 shows an internal structure of a headset according to the second embodiment.

FIG. 4 shows an internal structure of a headset 110 according to the second embodiment. The headset 110 is different from the headset 100 in that the headset 110 has a mute operation part 2a instead of the mute operation part 2 in the headset 100 shown in FIG. 2, and is otherwise the same.

The mute operation part 2a includes an operation switch 21 and a capacitor 24. One end of the operation switch 21 is connected to the first transmission line 31, and the other end of the operation switch 21 is connected to the ground wire 32 via the capacitor 24. When the user causes the operation switch 21 to enter the conductive state, a loop is formed from the power supply, via the resistor 201, the connection terminal 4, the first transmission line 31, the operation switch 21, the capacitor 24, and the ground wire 32 to the ground, and therefore the first electrical signal based on the sound collected by the microphone 11 is not transmitted through the first transmission line 31, and the headset 110 enters into the mute state. If the operation switch 21 is rendered to the conductive state in this manner, a line in which the first electrical signal is flowing would not be disconnected, and therefore noise is hardly generated when the headset 110 is switched from the non-mute state to the mute state.

In this manner, the headset 110 can suppress noise when switching to the mute state by using fewer components than the headset 100 according to the first embodiment. However, since the loop is formed in the mute state, the magnetic coupling may occur among the first transmission line 31, the second transmission line 33, and the third transmission line 34. Therefore, the configuration of the headset 110 is suitable for a configuration in which, for example, the first transmission line 31, the second transmission line 33, and the third transmission line 34 are twisted together and their mutual inductance is sufficiently small.

The present invention is explained on the basis of the exemplary embodiments. The technical scope of the present invention is not limited to the scope explained in the above embodiments and it is possible to make various changes and modifications within the scope of the invention. For example, all or part of the apparatus can be configured to be functionally or physically distributed and integrated in arbitrary units. Further, new exemplary embodiments generated by arbitrary combinations of them are included in the exemplary embodiments of the present invention. The effect of the new embodiment caused by the combination has the effect of the original embodiment together.

What is claimed is:

1. A headset comprising:
a microphone that converts a sound to a first electrical signal;
a first transmission line that transmits the first electrical signal generated by the microphone to an external device;
a connection terminal that connects the first transmission line to the external device;
an operation switch that receives an operation for switching between (i) a non-mute state in which the first electrical signal is transmitted to the external device and (ii) a mute state in which the first electrical signal is not transmitted to the external device;
an electronic switch that switches between (i) a conductive state in which the first electrical signal is transmitted and (ii) a non-conductive state in which the first electrical signal is not transmitted, on the basis of a control voltage which changes according to the state of the operation switch, the electronic switch being provided between the microphone and the connection terminal; and
a voltage generator that generates the control voltage, wherein
one end of the operation switch is connected to a ground, and the other end of the operation switch is connected to the voltage generator,
the voltage generator generates the control voltage at a high level when the operation switch is not conducting, and generates the control voltage at a low level when the operation switch is conducting, and
the electronic switch is in a conductive state when the control voltage is at a high level, and is in a non-conductive state when the control voltage is at a low level.

2. The headset according to claim 1, wherein the voltage generator includes a delay circuit that makes a time required for a transition of a level of the control voltage longer than a time required for switching of the operation switch.

3. The headset according to claim 1, wherein the voltage generator generates the control voltage on the basis of power supplied from the external device via the first transmission line.

4. The headset according to claim 1, further comprising:
a speaker that outputs a sound based on a second electrical signal output by the external device; and
a second transmission line that transmits the second electrical signal from the external device to the speaker, the second transmission line being accommodated in a cable in which the first transmission line is accommodated.

5. A headset comprising:
a microphone that converts a sound to a first electrical signal;
a first transmission line that transmits the first electrical signal generated by the microphone to an external device;
a connection terminal that connects the first transmission line to the external device;
an operation switch that receives an operation for switching between (i) a non-mute state in which the first electrical signal is transmitted to the external device and (ii) a mute state in which the first electrical signal is not transmitted to the external device;

an electronic switch that switches between (i) a conductive state in which the first electrical signal is transmitted and (ii) a non-conductive state in which the first electrical signal is not transmitted, on the basis of a control voltage which changes according to the state of the operation switch, the electronic switch being provided between the microphone and the connection terminal; and a voltage generator that generates the control voltage, wherein the electronic switch is a field effect transistor, and the voltage generator includes:

a capacitor provided between a gate terminal of the electronic switch and a ground, a first resistor provided between the gate terminal and a drain terminal of the electronic switch, and a second resistor provided between the gate terminal and the operation switch, with one end of the second resistor which is opposite to the gate terminal side entering into an open state in the non-mute state and the one end of the second resistor being connected to a ground in the mute state.

6. The headset according to claim 5, wherein a resistance value of the second resistor is smaller than a resistance value of the first resistor.

7. A headset comprising:

a microphone that converts a sound to a first electrical signal;

a first transmission line that transmits the first electrical signal generated by the microphone to an external device;

a connection terminal that connects the first transmission line to the external device;

an operation switch that receives an operation for switching between (i) a non-mute state in which the first electrical signal is transmitted to the external device and (ii) a mute state in which the first electrical signal is not transmitted to the external device;

an electronic switch that switches between (i) a conductive state in which the first electrical signal is transmitted and (ii) a non-conductive state in which the first electrical signal is not transmitted, on the basis of a control voltage which changes according to the state of the operation switch, the electronic switch being provided between the microphone and the connection terminal;

a voltage generator that generates the control voltage; and a capacitor provided in series with the operation switch, between the first transmission line and a ground, wherein the operation switch is provided between the first transmission line and one end of the capacitor, and the other end of the capacitor is connected to the ground.

* * * * *